United States Patent [19]

Ghaffaripour

[11] Patent Number: 5,436,588

[45] Date of Patent: Jul. 25, 1995

[54] CLICK/POP FREE BIAS CIRCUIT

[75] Inventor: Parviz Ghaffaripour, Saratoga, Calif.

[73] Assignee: National Semiconductor Corp., Santa Clara, Calif.

[21] Appl. No.: 168,448

[22] Filed: Dec. 17, 1993

[51] Int. Cl.⁶ ............................................. H03K 3/01
[52] U.S. Cl. .................... 327/538; 327/365; 327/543
[58] Field of Search ............. 307/296.1, 296.4, 296.6, 307/296.8, 246, 270, 570, 315, 263, 272.3, 578; 327/530, 538, 543, 365, 108, 575, 142, 390, 170

[56] References Cited

U.S. PATENT DOCUMENTS

| | | | |
|---|---|---|---|
| 3,760,191 | 9/1973 | Jones | 307/246 |
| 3,987,317 | 10/1976 | Hongu et al. | 307/296.6 |
| 4,035,669 | 7/1977 | Yokoyama | 307/246 |
| 4,115,748 | 9/1978 | Kubo et al. | 307/290 |
| 4,246,499 | 1/1981 | Iida | 307/246 |
| 4,521,705 | 6/1985 | Bartels | 307/246 |
| 4,783,607 | 11/1988 | Hsieh | 307/290 |
| 5,128,553 | 7/1992 | Nelson | 307/296.1 |
| 5,149,988 | 9/1992 | Smith et al. | 307/296.6 |
| 5,305,259 | 4/1994 | Kim | 307/296.6 |
| 5,331,209 | 7/1994 | Fujisawa et al. | 307/272.3 |

Primary Examiner—Timothy P. Callahan
Assistant Examiner—T. Lam
Attorney, Agent, or Firm—H. Donald Nelson; Skjerven, Morrill, MacPherson, Franklin & Friel; Edward C. Kwok

[57] ABSTRACT

A bias control circuit and an associated method in an audio output amplifier provide slow turn-on or turn-off operation of a bias voltage generation circuit, using an external bypass capacitor. A slow rate in the turn-on and turn-off operations in such a bias voltage generation circuit prevents click or pop noises. In one embodiment, two bipolar transistors each responsive to the voltage on an external capacitor are provided to gradually increase the voltage of an output node, which can be used to drive the gate terminal of an MOS transistor in the bias voltage generation circuit. Alternatively, in another embodiment, an MOS inverter, which receives as input the voltage on bypass capacitor, is provided to divert current from a conventional bias circuit. The rate at which the MOS inverter diverts current from the conventional bias circuit controls the slew rate in the turn-off operation of the bias current. Adjustment to this slew rate can be accomplished by adjusting the resistance and capacitance values of resistor and bypass capacitor, respectively.

6 Claims, 3 Drawing Sheets

CLICK/POP FREE BIAS CIRCUIT

BACKGROUND OF THE INVENTION

1. Field of the Invention

The present invention relates to the design of integrated circuits; and, in particular relates to the design of integrated circuits for audio applications, such as audio amplifiers.

2. Discussion of the Related Art

In an audio system, the speakers are driven by audio amplifiers. Without special measures to provide a gradual turning on or turning off of such audio amplifiers, audible sounds, commonly known as "clicks" and "pops," can result. These sounds are not only acoustically unpleasant, the current associated with clicks and pops can damage the speakers. Thus, an audio system using an integrated circuit audio amplifier typically provides components external to the integrated circuit to avoid clicks and pops. Such external components cannot be easily integrated into the audio amplifier, since they typically include large capacitances which cannot be practically provided on the integrated circuit. These external components also occupy valuable board space and increase system cost. Thus, there is a need to minimize the external components necessary for avoiding clicks and pops.

An integrated circuit audio amplifier, however, provides an input pin for connection of a bypass capacitor to a DC reference voltage ("half-supply") between a power supply $V_{dd}$ and a power supply $V_{SS}$. Such a bypass capacitor protects the integrated circuit from undesirable effects of noise in the power supplies.

SUMMARY OF THE INVENTION

In accordance with the present invention, a structure and a method provide in an integrated circuit, which is coupled to an external capacitor, a bias control circuit including:

(i) a switch;

(ii) a voltage divider coupled by the switch between a supply voltage source and a ground voltage to selectably charge the external capacitor to a predetermined voltage between the voltage of the supply voltage source and the ground voltage, and discharge the external capacitor to the ground voltage; and (iii) a control circuit, coupled to the external capacitor, for providing a voltage or current which changes correspondingly with the rate at which the external capacitor is discharged.

In one embodiment of the present invention, the control circuit includes a first bipolar transistor having a base terminal coupled to the external capacitor, and a collector terminal coupled to the ground voltage. In addition, the base terminal of a second bipolar transistor is coupled to an emitter of the first bipolar transistor. The second bipolar transistor has a collector terminal coupled to the ground voltage and an emitter terminal for providing an output voltage. The output voltage is used to drive a second switch, so that the switch is turned on at a rate commensurate with the rate of change of the output voltage, when the external capacitor is discharged.

In another embodiment of the present invention, the control circuit includes an MOS inverter coupled between the supply voltage and the external capacitor. The MOS inverter receives an input signal which indicates a discharge phase of the external capacitor. In response to this input signal, the MOS inverter provides an output voltage which changes at a rate corresponding to the rate of discharge of the external capacitor. In that embodiment, the output voltage of the MOS inverter drives a second switch, to regulate a current which changes in response to the rate of change of the output voltage of the MOS inverter. In that embodiment, the MOS inverter includes long channel MOS transistors.

The present invention minimizes the number of external components necessary to avoid clicks and pops in an audio system, by taking advantage of the bypass capacitor provided to protect the integrated circuit from power supply noises.

The present invention is better understood upon consideration of the detailed description below and the accompanying drawings.

DETAILED DESCRIPTION OF PREFERRED EMBODIMENTS

Figure 1:
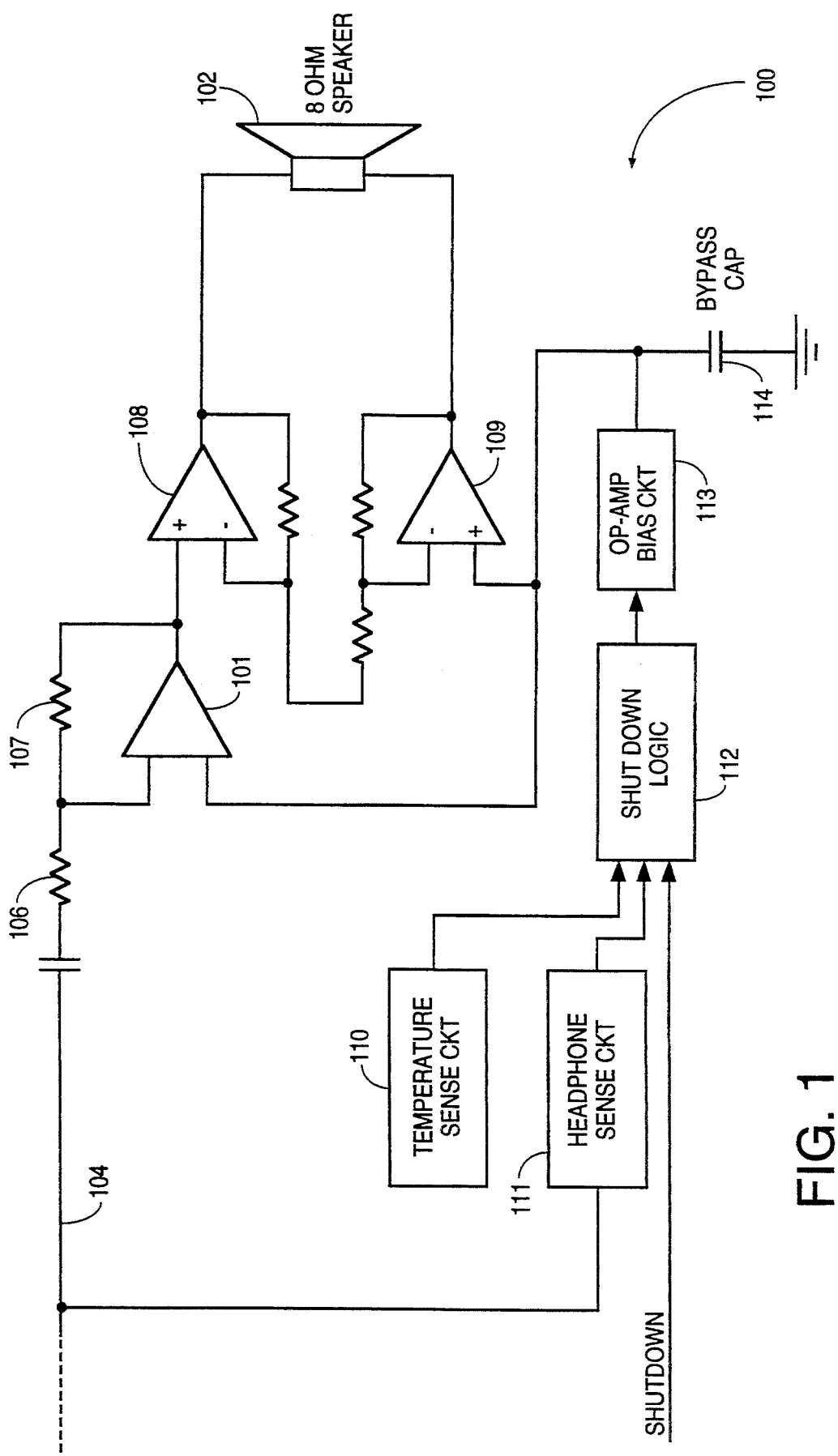
FIG. 1 shows an audio output circuit 100 in which an embodiment of the present invention is deployed.

One embodiment of the present invention is implemented in an audio output circuit 100, in which an 8-ohm speaker is driven by a pair of power amplifiers in a bridge configuration, as shown in FIG. 1. Although audio output circuit 100 is shown here as implemented in a bridge configuration, the bridge configuration is provided for illustration only. The present invention is applicable to other audio output circuits also, as will be evident from the detailed description below. As shown, audio output circuit 100 is a monophonic output circuit of an audio system.

As shown in FIG. 1, signals 104 represents a signal in an audio channel to be amplified by gain amplifier 101. In circuit 100, amplifiers 108 and 109 are provided in a bridge configuration to drive 8-ohm speaker 102. Audio output circuit 100 also consists of a shut-down logic circuit 112, a bias circuit 113, which provides the bias voltages used in amplifiers 108 and 109 and disables output of current to speaker 102. In FIG. 1, the output of current to speaker 102 is disabled by bias circuit 113 charging a capacitor 114. Shut-down logic circuit 112, which controls the operation of bias circuit 113, is responsive to a temperature sense circuit 110 and a headphone sensing circuit 111.

Figure 2:
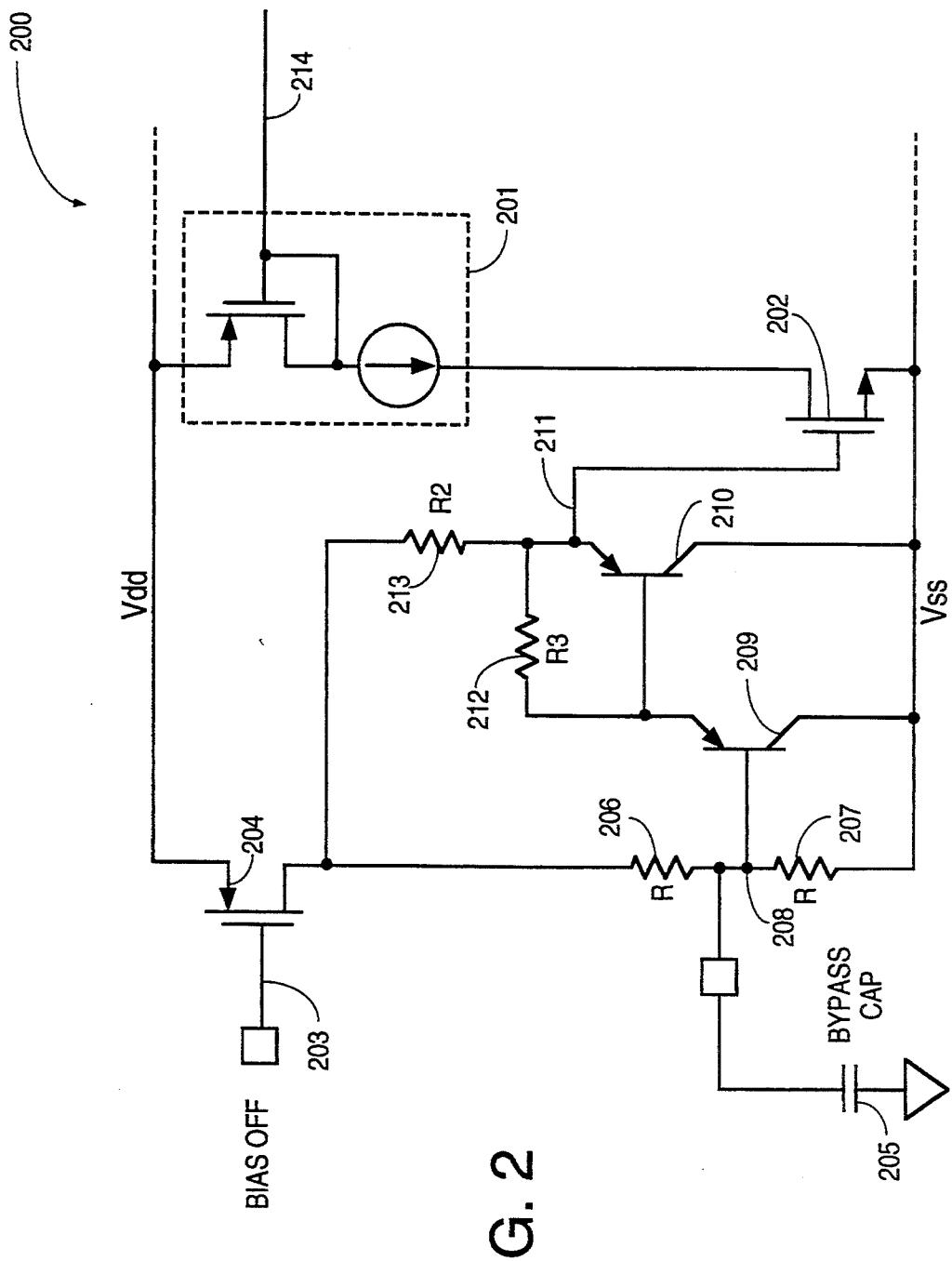
FIG. 2 shows a control circuit 200 of bias circuit 113 in audio output circuit 100; control circuit 200 includes an embodiment of the present invention for gradually turning on and off a conventional bias generation circuit 201.

Bias circuit 113 generates a number of bias voltages for use in amplifiers 108 and 109. FIG. 2 shows a circuit 200, which controls the turning-on and the turning-off operations of bias circuit 113. In FIG. 2, a conventional circuit 201 for generating a bias voltage on lead 214 is switched off by transistor NMOS 202. NMOS transistor 202 is provided by a transistor having a drawn width-to-length (W/L) ratio of 300/1[1] in one embodiment, although a smaller size transistor can also be used in a design choice to achieve a smaller layout area. Circuit 200 is powered up and powered down by the logic low (low voltage) and logic high (high voltage) states, respectively, of a control signal ("bias-off") on lead 203.[1]

[1] In the present embodiment, the drawn W/L dimensions are provided in microns, and a shrink factor of 0.8 is provided in one manufacturing process, such that a W/L=300/1 transistor is manufactured as a 240 microns by 0.8 microns transistor.

During power up, the bias-off control signal on lead 203 goes to logic low, thereby turning on PMOS transistor 204 and charging external bypass capacitor 205 through resistor 206. In this embodiment, bypass capacitor can have any convenient value suitable for minimizing ground noises, such as 0.1 uF. Resistors 206 and 207, each having a resistive value of 50 Kohms[2], form a voltage divider to gradually bring node 208 to one-half the voltage of power supply $V_{dd}$. AS transistor 204 turns on, PNP transistors 209 and 210 are also turned on, drawing current through resistors 213 and 212. In this embodiment, PNP transistors 209 and 210 are parasitic bipolar transistors each having a drawn area of one square micron, and resistors 212 and 213 are each 50 Kohms. Thus, the voltage at node 211 exceeds the voltage at node 208 by two base-to-emitter voltage ($V_{be}$) drops and rises at the same RC time constant as node 208. The increase in voltage at node 202 slowly turns on transistor 202 to enable the bias generation circuit 201 to become operational. In this manner, since bias generation circuit 201 is not turned on abruptly, a click or pop noise due to the sudden turning on of bias voltages at amplifiers 108 and 109 is avoided. One of ordinary skill in the art would appreciate that the voltage at node 208 can also be used to turn on transistor 202. However, the extra two $V_{be}$ voltage drops allow circuit 200 to operate under a power supply voltage $V_{dd}$ as low as 2.5 volts. Without the two $V_{be}$ drops, the final voltage of 1.25 volts at node 208 may still be insufficient to fully turn on transistor 202.

[2] In this embodiment, a resistor of a given size is achieved by a suitably sized lightly doped drain.

Conversely, during the turning-off operation of bias circuit 113, when bias-off control signal goes to logic high, thereby switching off transistor 204, bypass capacitor, initially at half the voltage of power supply voltage $V_{dd}$, discharges to ground voltage (i.e. $V_{SS}$) gradually through resistor 207. As transistor 204 turns off, PNP transistors 209 and 210 are also turned off, such that node 211 discharges through resistors 213, 206 and 207 to the ground voltage. Consequently, transistor 202 is gradually switched off to turn off the bias generation circuit 201. Again, since transistor 202 is gradually turned off, click and pop noises induced by abrupt changes in the bias voltages of amplifiers 108 and 109 are avoided.

Figure 3:
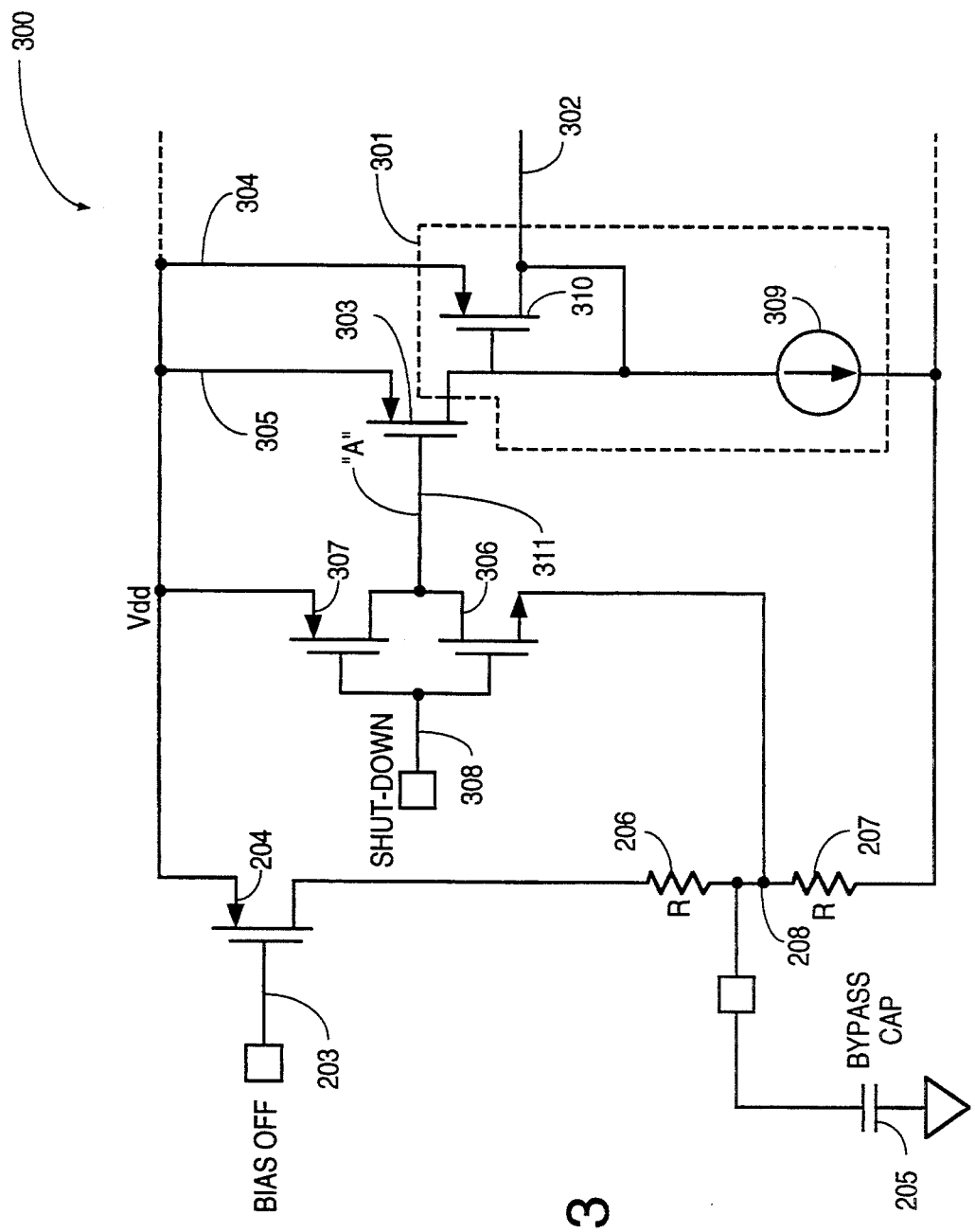
FIG. 3 shows a control circuit 300 of bias circuit 113 in audio output circuit 100; circuit 300 includes an embodiment of the present invention allowing slew rate control when switching off a conventional bias generation circuit 301.

FIG. 3 shows a control circuit 300 of bias circuit 113 for controlling the turning-off operation of a conventional bias generation circuit 301, which provides a current in lead 302 for generating a bias voltage. Circuit 300 also takes advantage of the external bypass capacitor 205 to effectuate a gradual turning off of bias generation circuit 301. To simplify cross reference between FIGS. 2 and 3, the common components in FIGS. 2 and 3 are provided the same reference numerals. Circuit 300 receives an input signal ("shutdown") on node 308. The turning-off operation of bias generation circuit 301 is signalled by the shutdown signal going to logic high state.

Initially, during normal operation, transistor 204 is on, so that the voltage divider formed by resistors 206 and 207 maintains the voltage on external bypass capacitor 205 at substantially one half of supply voltage $V_{dd}$. When both the shutdown signal and the bias-off signal go to logic high, transistors 204 and 307 are turned off rapidly. Consequently, the voltage on bypass capacitor 205 discharges at an RC time constant determined by the capacitance of bypass capacitor 205 and the resistance of resistor 207. At the same time, transistor 306 is turned on, so that the voltage at node 311 rapidly drops from substantially $V_{dd}$ to the voltage on bypass capacitor 205 (i.e. substantially one half of supply voltage $V_{dd}$). As bypass capacitor 205 discharges towards ground voltage, the voltage on node 311 decreases at the same rate as the discharge of bypass capacitor 205. Thus, the current in PMOS transistor 303 increases gradually. Since the sum of the currents in transistors 310 and 303 is constrained by current source 309, the gradual increase in current in transistor 303 results in a corresponding decrease in current, at the same rate, in transistor 310. Consequently, the bias generation circuit 301 is shutdown gradually without causing clicks or pops in the output amplifier. The rate of current increase in transistor 303 can be adjusted by changing the resistance and capacitance values of resistor 207 and bypass capacitor 205. Thus, bias control circuit 300 also acts a slew rate control circuit for the audio output amplifier. In this embodiment, transistors 306 and 307 are implemented by long channel MOS transistors to take advantage to the relatively high resistance in such MOS transistors.

The above detailed description is provided to illustrate the specific embodiments of the present invention and is not intended to be limiting. Many modifications and variations within the scope of the present invention are possible. For example, the values and sizes of transistors and resistors are provided hereinabove as exemplary values only. Other suitable values are readily provided by one of ordinary skill in accordance with the teachings of above detailed description. The present invention is defined by the following claims.

I claim:

1. In an integrated circuit, said integrated circuit being coupled through an external capacitor to a reference voltage, a bias control circuit comprising:
    a switch;
    a voltage divider coupled by said switch between a supply voltage source and a ground voltage to selectably charge said external capacitor to a predetermined voltage between the voltage of said supply voltage source and said ground voltage, and discharge said external capacitor to said ground voltage; and
    a control circuit coupled to said external capacitor, said control circuit providing a voltage or current which changes correspondingly with the rate at which said external capacitor is discharged;
    wherein said control circuit comprises:
        a first bipolar transistor having a base terminal coupled to said external capacitor, and a collector terminal coupled to said ground voltage;
        a second bipolar transistor having a base terminal coupled to an emitter of said first bipolar transistor, a collector terminal coupled to said ground voltage and an emitter terminal for providing an output voltage; and
        a second switch coupled to receive said output voltage, said second switch being turned off at a rate commensurate with the rate of change of said output voltage when said external capacitor is discharged.

2. In an integrated circuit, said integrated circuit being coupled through an external capacitor to a reference voltage, a bias control circuit comprising:

a switch;

a voltage divider coupled by said switch between a supply voltage source and a ground voltage to selectably charge said external capacitor to a predetermined voltage between the voltage of said supply voltage source and said ground voltage, and discharge said external capacitor to said ground voltage; and a control circuit coupled to said external capacitor, said control circuit providing a voltage or current which changes correspondingly with the rate at which said external capacitor is discharged;

wherein said control circuit comprises:

an MOS inverter coupled between said supply voltage and said external capacitor, said MOS inverter receiving an input signal indicating a discharge phase of said external capacitor and providing an output voltage which changes at a rate corresponding to the rate of discharge of said capacitor; and a second switch receiving said output voltage of said MOS inverter for regulating a current which changes at a rate corresponding to said rate of change of said output voltage.

3. A bias control circuit as in claim 2, wherein said MOS inverter comprises long channel MOS transistors.

4. In a bias control circuit of an integrated circuit, said integrated circuit being coupled through an external capacitor to a reference voltage, a method comprising the steps of:

providing a switch;

coupling a voltage divider through said switch between a supply voltage source and a ground voltage to selectably charge said external capacitor to a predetermined voltage between the voltage of said supply voltage source and said ground voltage, and discharge said external capacitor to said ground voltage; and coupling a control circuit to said external capacitor, said control circuit providing a voltage or current which changes correspondingly with the rate at which said external capacitor is discharged;

wherein said step of coupling a control circuit comprises the steps of:

coupling a base terminal of a first bipolar transistor to said external capacitor, and a collector terminal of said first bipolar transistor to said ground voltage;

coupling a base terminal of a second bipolar transistor to an emitter of said first bipolar transistor, and an emitter terminal of said second bipolar transistor to provide an output voltage; and coupling a second switch to receive said output voltage, said second switch being turned off at a rate commensurate with the rate of change of said output voltage when said external capacitor is discharged.

5. In a bias control circuit of an integrated circuit, said integrated circuit being coupled through an external capacitor to a reference voltage, a method comprising the steps of:

providing a switch;

coupling a voltage divider through said switch between a supply voltage source and a ground voltage to selectably charge said external capacitor to a predetermined voltage between the voltage of said supply voltage source and said ground voltage, and discharge said external capacitor to said ground voltage; and coupling a control circuit to said external capacitor, said control circuit providing a voltage or current which changes correspondingly with the rate at which said external capacitor is discharged;

wherein said step of coupling a control circuit comprises the steps of:

coupling an MOS inverter between said supply voltage and said external capacitor, said MOS inverter receiving an input signal indicating a discharge phase of said external capacitor and providing an output voltage which changes at a rate corresponding to the rate of discharge of said capacitor; and regulating a current which changes at a rate corresponding to said rate of change of said output voltage.

6. A method as in claim 5, wherein said step of coupling an MOS inverter comprises the step of providing long channel MOS transistors in said MOS inverter.

* * * * *